(12) United States Patent
Lin et al.

(10) Patent No.: US 10,522,662 B1
(45) Date of Patent: Dec. 31, 2019

(54) FINFET DEVICE WITH T-SHAPED FIN AND METHOD FOR FORMING THE SAME

(71) Applicant: Taiwan Semiconductor Manufacturing Co., Ltd., Hsinchu (TW)

(72) Inventors: Chun-Neng Lin, Hsinchu County (TW); Shian-Wei Mao, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 14 days.

(21) Appl. No.: 16/015,521

(22) Filed: Jun. 22, 2018

(51) Int. Cl.
| | | |
|---|---|---|
| H01L 29/78 | (2006.01) | |
| H01L 29/66 | (2006.01) | |
| H01L 21/311 | (2006.01) | |
| H01L 21/306 | (2006.01) | |

(52) U.S. Cl.
CPC .. *H01L 29/66818* (2013.01); *H01L 21/30604* (2013.01); *H01L 21/31111* (2013.01); *H01L 29/7853* (2013.01)

(58) Field of Classification Search
None
See application file for complete search history.

(56) References Cited

U.S. PATENT DOCUMENTS

| | | | |
|---|---|---|---|
| 8,455,321 B2 * | 6/2013 | Lai | H01L 29/785 257/E21.442 |
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2014/0227878 A1 * | 8/2014 | Yang | H01L 29/785 438/702 |

* cited by examiner

*Primary Examiner* — Minh Loan Tran
(74) *Attorney, Agent, or Firm* — Birch, Stewart, Kolasch & Birch, LLP

(57) ABSTRACT

A method of forming a semiconductor device structure is provided. The method includes forming a fin structure protruding from a substrate and forming a first liner layer to cover a top surface and a sidewall of the fin structure. The first liner layer is patterned by performing a wet etching process, so as to remain a portion of the first liner layer that covers the top surface of the fin structure and a portion of the sidewall of the fin structure. The remained portion of the first liner layer is used as an etch mask to remove a portion of the fin structure from the sidewall of the fin structure, so as to form a lateral recess in the fin structure.

20 Claims, 9 Drawing Sheets

FINFET DEVICE WITH T-SHAPED FIN AND METHOD FOR FORMING THE SAME

BACKGROUND

The semiconductor industry has experienced rapid growth and demands for highly integrated semiconductor devices are increasing. Technological advances in integrated circuit (IC) design and materials have produced generations of ICs. Each generation has smaller and more complex circuits than previous generations. In the course of IC evolution, functional density has generally increased while geometric size (i.e., the smallest component (or line) that can be created through a fabrication process) has decreased.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over three sides (e.g., wrapping) the fin. Advantages of the FinFET may include reducing the short channel effect and increasing the current flow.

Although existing FinFETs and methods of fabricating FinFETs have been generally adequate for their intended purposes, they have not been entirely satisfactory in all respects. For example, as the size of the FinFET has been reduced, is has become a challenge to integrate a fin-trim process into the fabrication processes of the FinFET device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
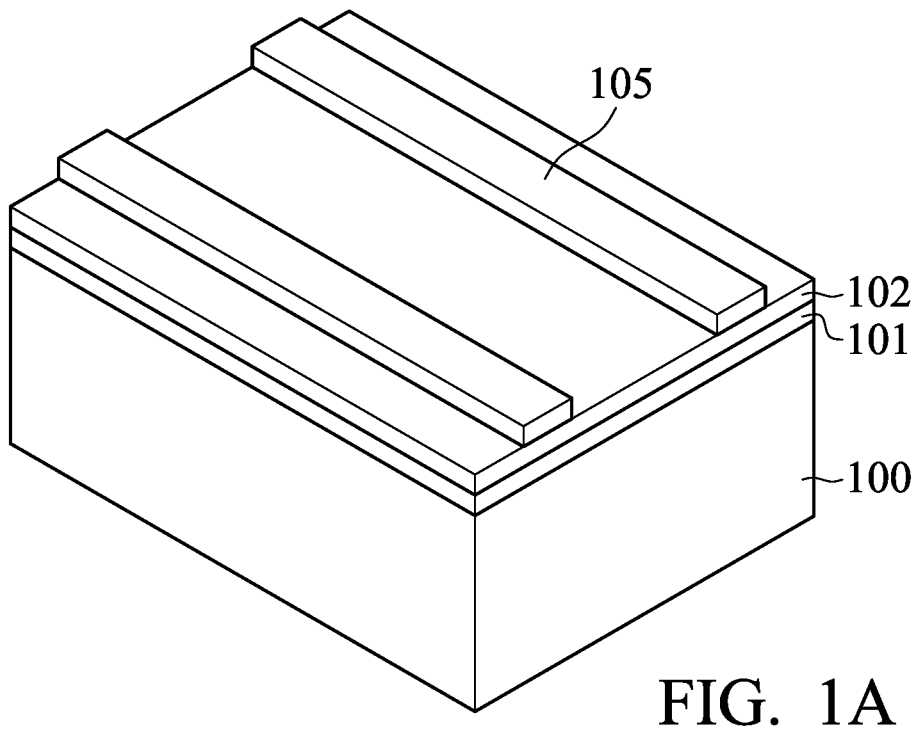
FIGS. 1A to 1J show perspective representations of various stages of forming a FinFET structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of methods of forming a semiconductor device structure are provided. The method of forming a semiconductor device structure includes forming a masking cap to cover a top surface and a portion of a sidewall of a fin structure protruding from a substrate. The formation of the masking cap includes forming a first liner layer and a second liner layer over the first liner layer that cover a top surface and a sidewall of the fin structure. The first and second liner layers are patterned by a wet etching process, so as to remain a portion of the first liner layer covering the top surface of the fin structure and a portion of the sidewall of the fin structure. The remained portion of the first liner layer serves as the masking cap. Afterwards, a portion of the fin structure is thinned by using the masking cap as an etch mask, so that the fin structure has a top portion with a width greater than that of the portion of the fin structure that is thinned. As a result, the fin structure can be thinned for enhancement of device performance without fin loss or damage to its top portion. After the masking cap is removed, the wider top portion of the fin structure can provide an etch-compensation to mitigate the fin loss or damage to the top portion of the fin structure in subsequent etching and/or cleaning processes for device fabrication, if presented, thereby increasing the reliability of the device with a fin structure.

Embodiments of a semiconductor device structure and a method of forming a semiconductor device structure are provided. FIGS. 1A to 1J show perspective representations of various stages of forming a fin field effect transistor (FinFET) structure, in accordance with some embodiments of the disclosure. A substrate 100 is provided, as shown in FIG. 1A in accordance with some embodiments. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

A first masking layer 101 and a second masking layer 102 successively stack over the substrate 100 for the subsequent patterning process, in accordance with some embodiments. As an example, the first masking layer 101 may be used as an etch stop layer when the second masking layer 102 is removed or etched. The first masking layer 101 may also be used as an adhesion layer that is formed between the substrate 100 and the second masking layer 102.

In some embodiments, the first masking layer 101 is made of silicon oxide and is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second masking layer 102 is made of silicon oxide, silicon nitride, silicon oxynitride, or another applicable material. In some other embodiments, more than one second masking layer 102 is formed over the first masking layer 101. In some embodiments, the second masking layer 102 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After formation of the first masking layer 101 and the second masking layer 102, a patterned photoresist layer 105 may be formed over the second masking layer 102 for subsequent definition of one or more fin structures in the substrate 100. In some embodiments, the patterned photoresist layer 105 is formed by a photolithography process. The photolithography process may include photoresist coating (e.g., spin-on coating), soft baking, mask aligning, exposure, post-exposure baking, developing the photoresist, rinsing and drying (e.g., hard baking).

Figure 1B:
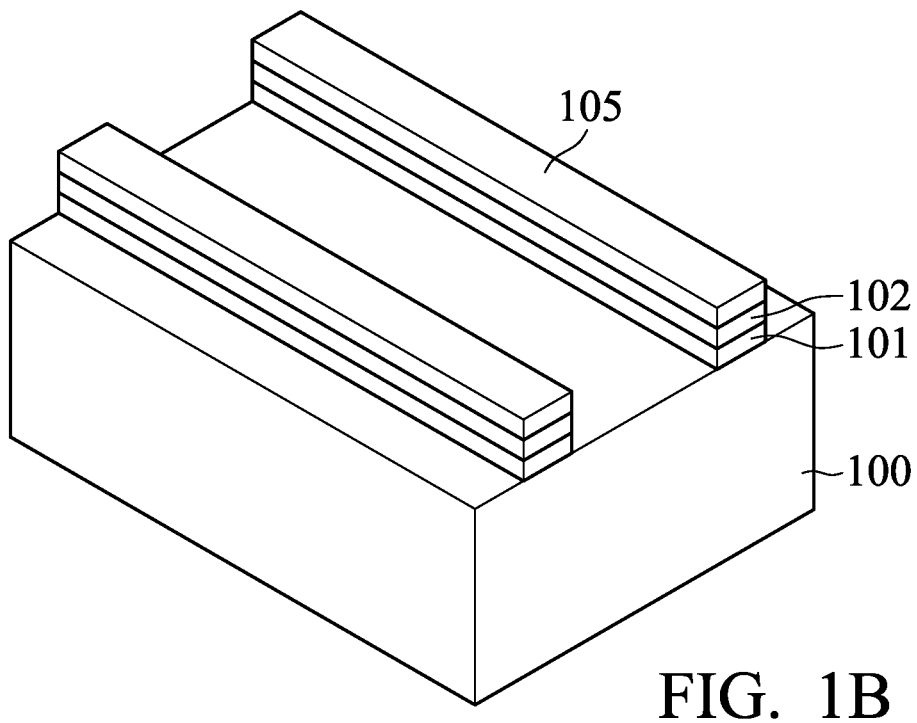

The first masking layer 101 and the overlying second masking layer 102 are patterned by using the patterned photoresist layer 105 as an etch mask, as shown in FIG. 1B in accordance with some embodiments. After the first masking layer 101 and the overlying second masking layer 102 are etched, a patterned first masking layer 101 and a patterned second masking layer 102 are formed, so that portions of the underlying substrate 100 are exposed.

Figure 1C:
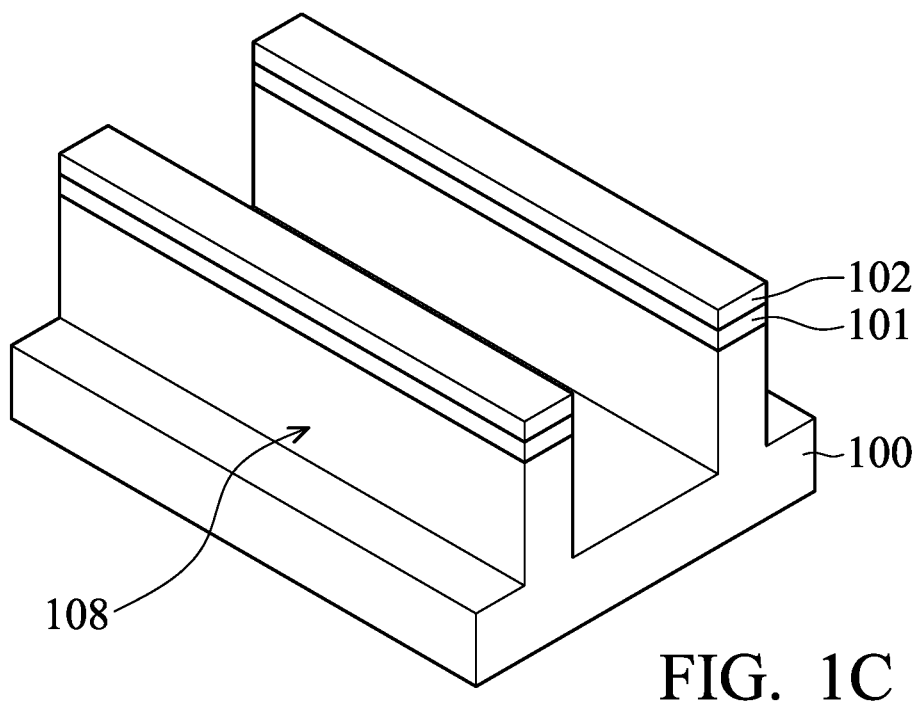

After the portions of the substrate 100 are exposed by forming the patterned first masking layer 101 and the patterned second masking layer 102, the patterned photoresist layer 105 is removed, as shown in FIG. 1C in accordance with some embodiments. Afterwards, the exposed portions of the substrate 100 are partially removed by an etching process using the patterned second masking layer 102 and the patterned first masking layer 101 as an etch mask. As a result, fin structures and trenches in the substrate 100 are formed. In order to simplify the diagram, two fin structures 108 protruding from the substrate 100 are depicted as an example. In some embodiments, each of the fin structures 108 has a top width that is greater than a desired or target width, so as to increase the fin strength for mitigating the fin damage, distortion, and/or collapse during the subsequent processes, such as etching and/or cleaning processes. Therefore, a fin-trim process is performed after the subsequent formed dummy gate structure is removed, thereby narrowing the fin width to obtaining a desired fin width. As a result, the device performance can be increased due to the reduction of the fin width.

In some embodiments, the etching process for formation of fin structures 108 is a dry etching process or a wet etching process. For example, the substrate 100 is etched by a dry etching process, such as a reactive ion etching (RIE), neutral beam etching (NBE), the like, or a combination thereof. The dry etching process may be performed using a process gas including fluorine-based etchant gas. For example, the process gas may include $SF_6$, $C_xF_y$, $NF_3$ or a combination thereof. The etching process may be a time-controlled process, and continue until the fin structures 108 are formed and reach a predetermined height. A person of ordinary skill in the art will readily understand other methods of forming the fin structures, which are contemplated within the scope of some embodiments.

Figure 1D:
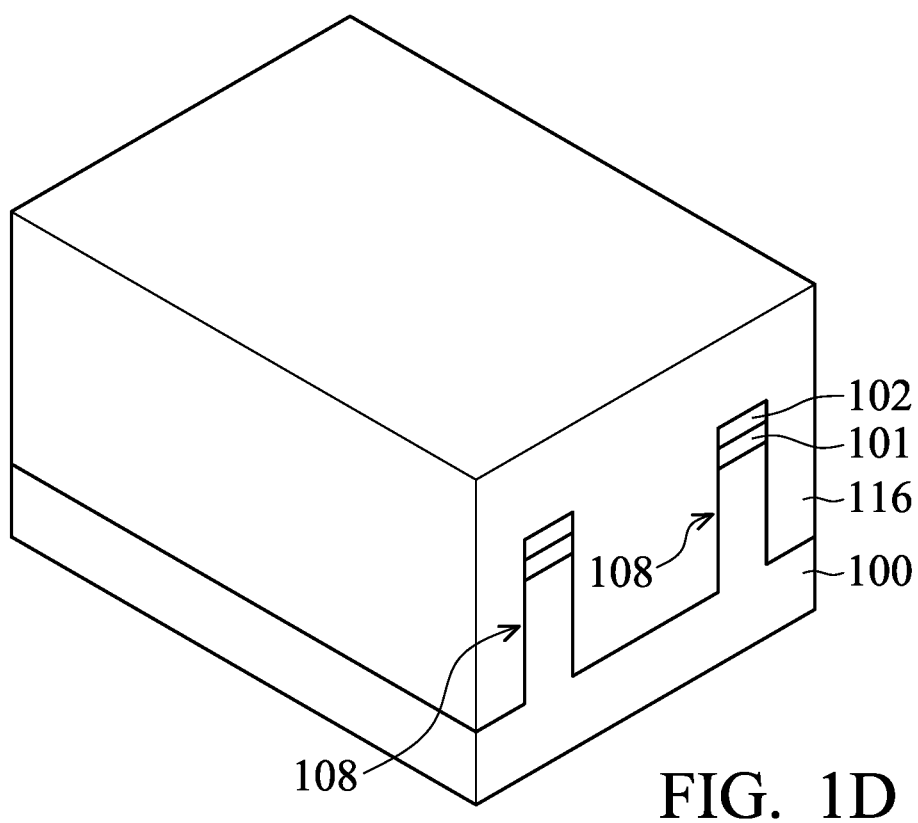

Afterwards, an insulating layer 116 is formed to cover the fin structures 108 over the substrate 100, as shown in FIG. 1D in accordance with some embodiments. In some embodiments, the insulating layer 116 is made of silicon oxide, fluoride-doped silicate glass (FSG), a low-k dielectric material, and/or another suitable dielectric material or another low-k dielectric material. The insulating layer 116 may be deposited by a chemical vapor deposition (CVD) process, a spin-on-glass process, or another applicable process.

In some other embodiments, before the insulating layer 116 is formed, one or more liners (not shown) are formed on the sidewalls of the fin structures 108 and the bottom of the trenches in the substrate 100. In those cases, the liner(s) may be formed of silicon oxide, silicon nitride, silicon oxynitride, silicon carbide (SiC), or a combination thereof. The liner(s) may be deposited by a chemical vapor deposition (CVD) process or another applicable process.

Afterwards, the insulating layer 116 is etched back to expose the top surface of the patterned second masking layer 102, in accordance with some embodiments. For example, the insulating layer 116 is etched back by a chemical mechanical polishing (CMP) process. After the top surface of the patterned second masking layer 102 is exposed, the patterned second masking layer 102 and the patterned first masking layer 101 are removed by one or more etching processes, so as to expose the top surfaces of the fin structures 108. For example, the patterned second masking layer 102 and the patterned first masking layer 101 are removed by a dry etching process, a wet etching process, or a combination thereof.

Figure 1E:
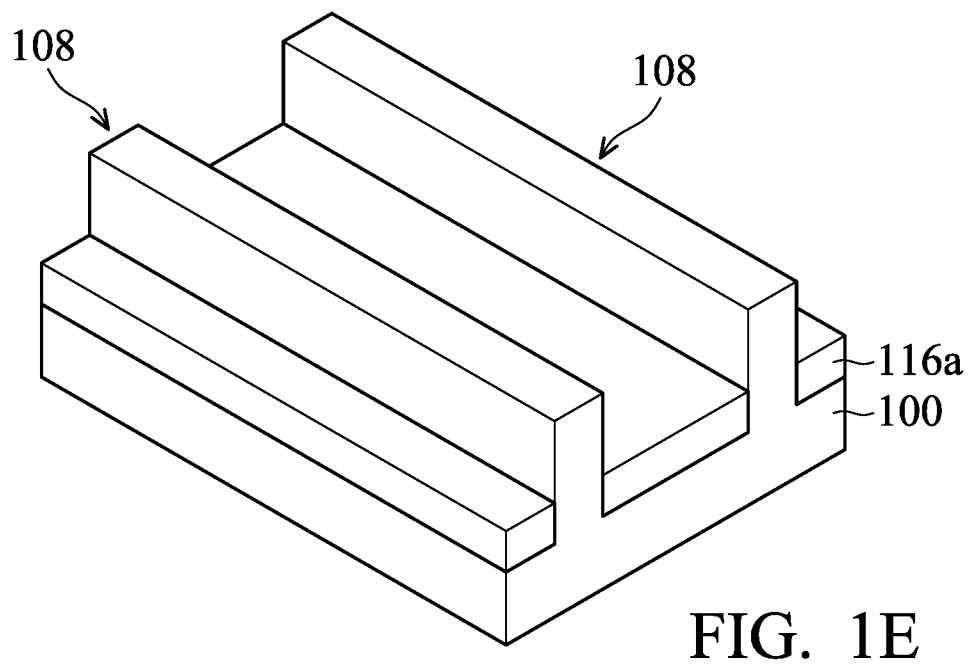

Afterwards, the exposed insulating layer 116 is further etched back to form isolation features 116a, as shown in FIG. 1E in accordance with some embodiments. In some embodiments, the isolation feature 116a includes the remaining insulating layer 116 and the liner(s) (not shown) surrounding the remaining insulating layer 116. The isolation features 116a may be shallow trench isolation (STI) structures surrounding the fin structures 108, so as to prevent electrical interference or crosstalk. A portion of the fin structure 108 is embedded in the isolation features 116a, so that the lower portion of each fin structure 108 is surrounded by the isolation features 116a and the upper portion of each fin structure 108 protrudes from the isolation features 116a.

Figure 1F:
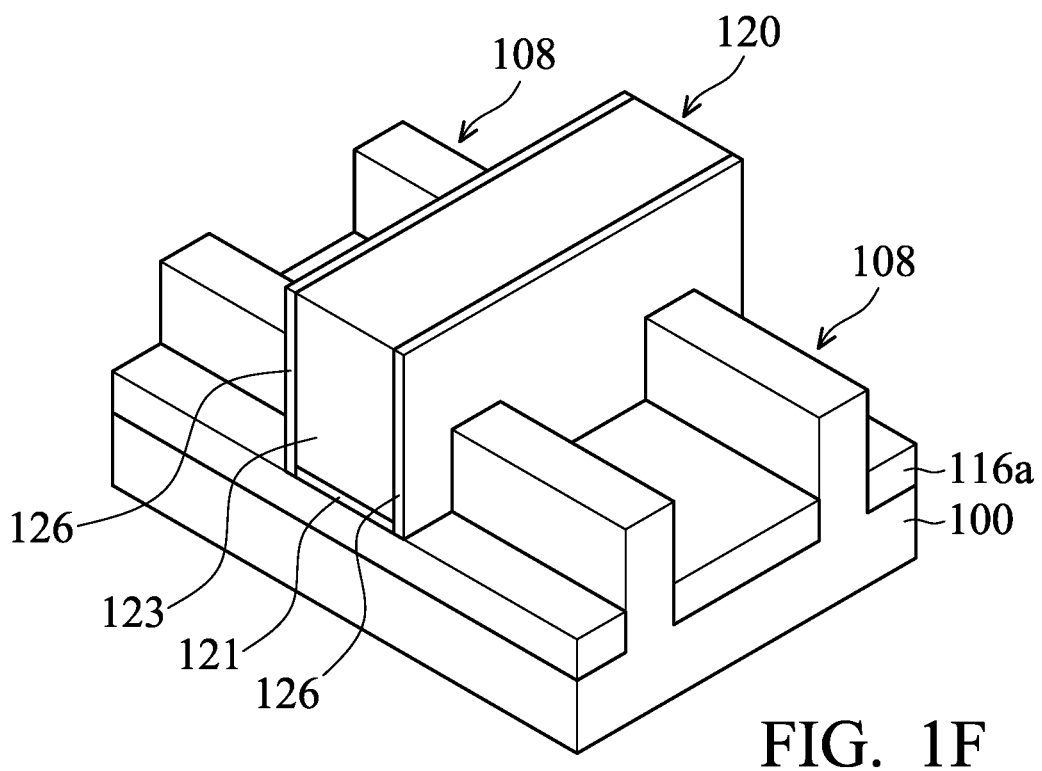

After formation of the isolation features 116a, a dummy gate structure 120 is formed across the fin structures 108 and extends over the isolation features 116a, as shown in FIG. 1F, in accordance with some embodiments. In some embodiments, the dummy gate structure 120 includes a dummy gate dielectric layer 121 and a dummy gate electrode layer 123 over the dummy gate dielectric layer 121.

The dummy gate dielectric layer 121 is made of a high-k dielectric material such as metal oxide in accordance with some embodiments. Examples of high-k dielectric materials include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the dummy gate dielectric layer 121 may be formed by chemical vapor deposition (CVD), physical vapor deposition, (PVD), atomic layer deposition (ALD), or other applicable processes.

After the dummy gate dielectric layer 121 is formed, the dummy gate electrode layer 123 is formed over dummy gate dielectric layer 121 in accordance with some embodiments. In some embodiments, the dummy gate electrode layer 123 is made of polysilicon. Afterwards, the dummy gate dielectric layer 121 and the dummy gate electrode layer 123 are patterned to form the dummy gate structure 120 over the fin structures 108, in accordance with some embodiments. In some other embodiments, the dummy gate structure 120 further includes a dummy cap layer (not shown) formed over the dummy gate electrode layer 123.

After the dummy gate structure 120 is formed, gate spacer layers 126 are formed on opposite sidewall surfaces of the dummy gate structure 120. The gate spacer layers 126 may be a single layer or multiple layers. In some embodiments, the gate spacer layers 126 are formed of silicon nitride, silicon oxide, silicon carbide, silicon oxynitride, or other applicable materials.

Figure 1G:
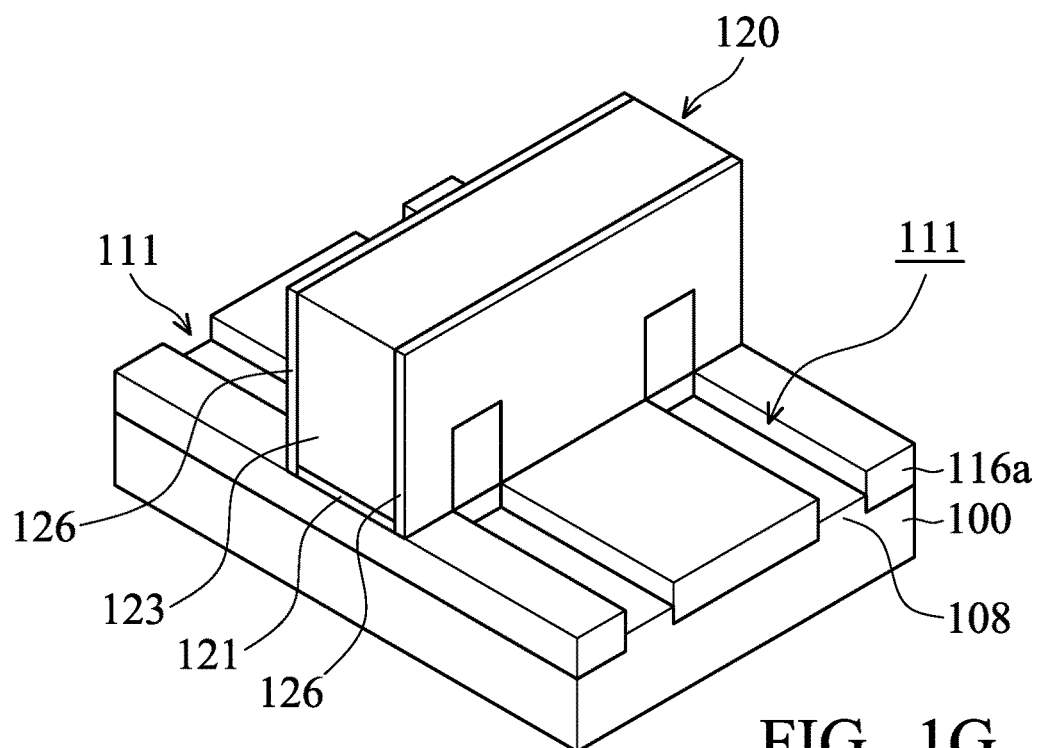

Openings 111 are formed in each fin structure 108 and on opposing sidewall surfaces of the dummy gate structure 120 by a fin recess process after the gate spacer layers 126 are formed, as shown in FIG. 1G in accordance with some embodiments. In some embodiments, the fin recess process is a dry etching process or a wet etching process. Moreover, after the fin recess process is performed, the bottom surfaces of the openings 111 are lower than the top surfaces of the isolation features 124.

Figure 1H:
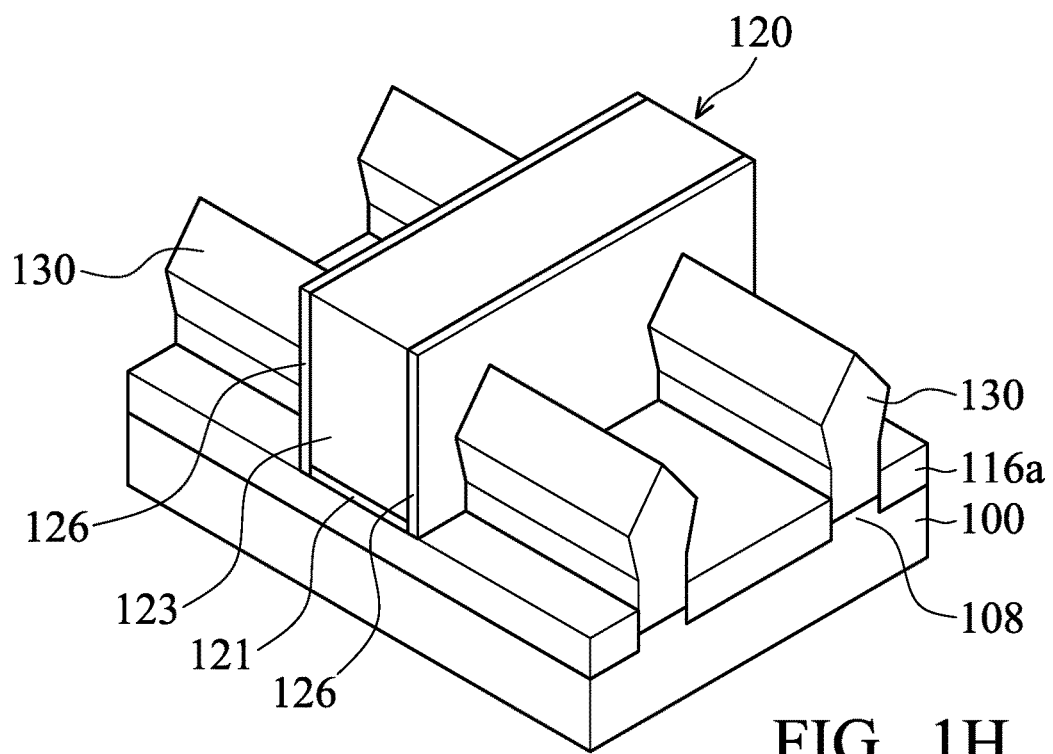

Afterwards, source and drain features 130 is formed in the openings 111 (indicated by FIG. 1G) of each fin structure 108 and protrudes from the openings 111, as shown in FIG. 1H in accordance with some embodiments. In some embodiments, portions of the fin structure 108 adjacent to the dummy gate structure 120 are recessed to form openings 111, and a strained material is grown in each opening 111 of the fin structure 108 by an epitaxial process to form the source and drain features 130. The source and drain features 130 are formed over the fin structure 108 on opposing sidewall surfaces of the dummy gate structure 120.

In some embodiments, the lattice constant of the strained material may be different from the lattice constant of the substrate 100. In some embodiments, the source and drain features 130 include Ge, SiGe, InAs, InGaAs, InSb, GaAs, GaSb, InAlP, InP, or the like.

Figure 1I:
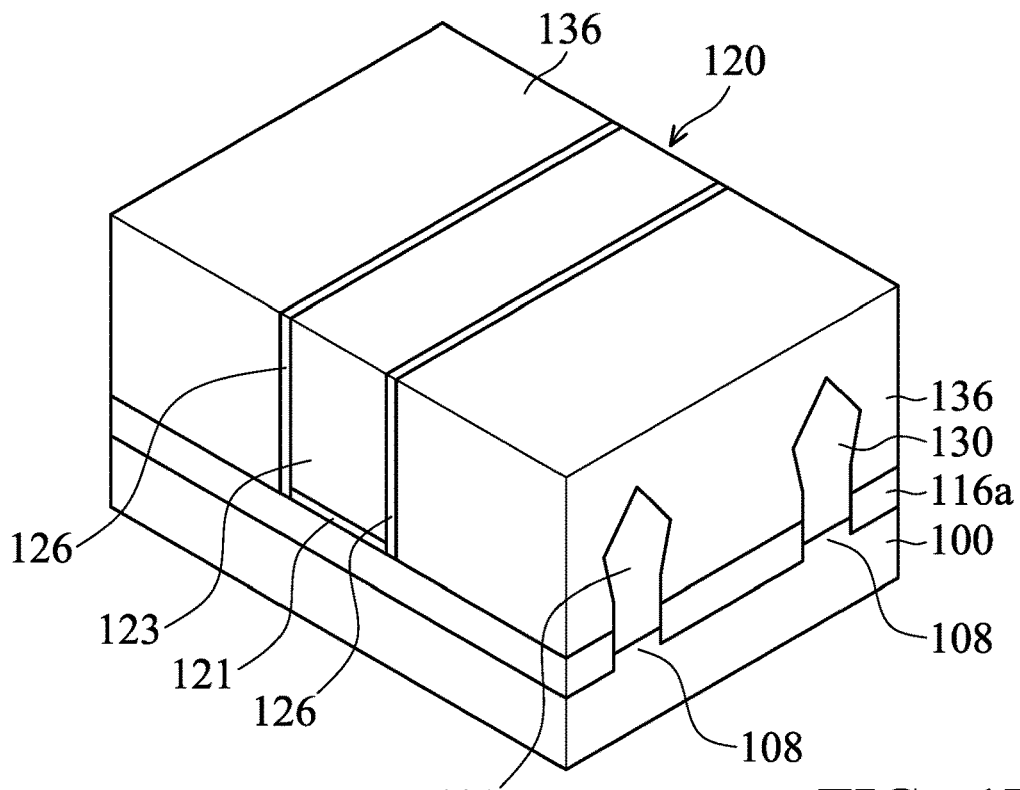

After the source and drain features 130 are formed, an insulating layer 136 (e.g., an inter-layer dielectric (ILD) layer) is formed over the substrate 100 and covers the source and drain features 130, as shown in FIG. 1I in accordance with some embodiments. In some embodiments, the insulating layer 136 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The insulating layer 136 may be formed by chemical vapor deposition (CVD), physical vapor deposition, (PVD), atomic layer deposition (ALD), spin-on coating, or another applicable process.

In some other embodiments, a contact etch stop layer (not shown) is formed between the substrate 100 and the insulating layer 136. The contact etch stop layer is made of silicon nitride, silicon oxynitride, and/or other applicable materials, in accordance with some embodiments. The contact etch stop layer may be formed by plasma enhanced chemical vapor deposition (PECVD), low-pressure chemical vapor deposition (LPCVD), atomic layer deposition (ALD), or other applicable processes.

Afterwards, a planarization process is performed on the insulating layer 136 until the top surface of the dummy gate structure 120 is exposed. In some embodiments, the insulating layer 136 is planarized by a polishing process, such as a chemical mechanical polishing (CMP) process.

Figure 1J:
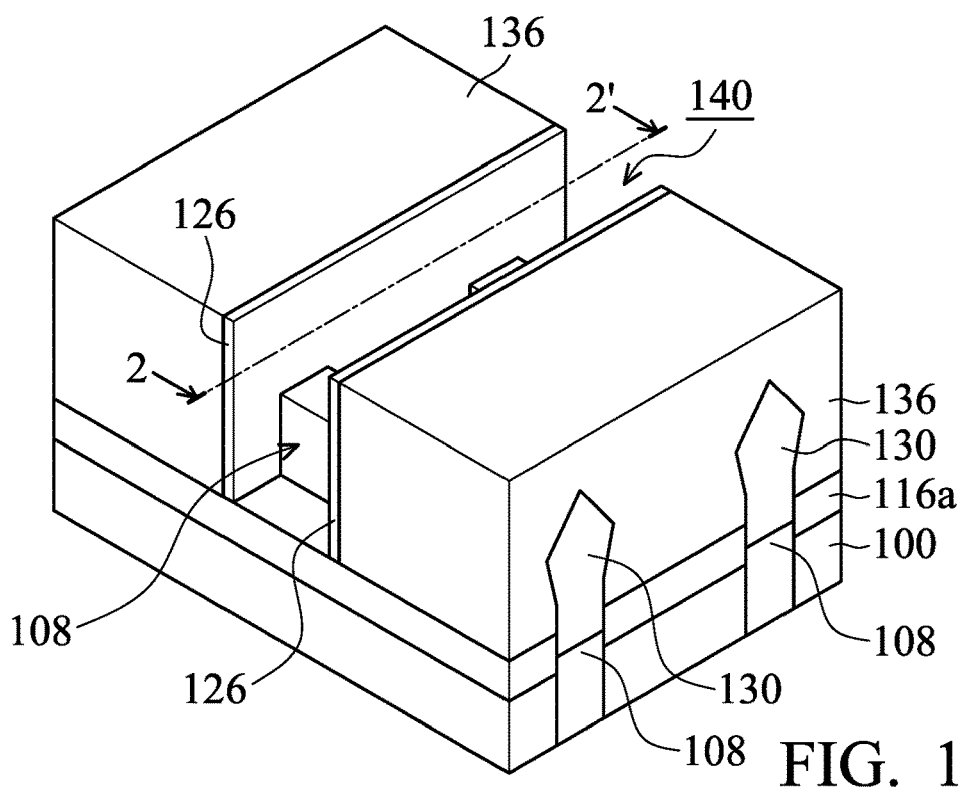

Afterwards, the dummy gate structure 120 is removed to form an opening 140 in the insulating layer 136, as shown in FIG. 1J in accordance with some embodiments. The dummy gate dielectric layer 121 and the dummy gate electrode layer 123 of the dummy gate structure 120 are removed by an etching process, such as a dry etching process or a wet etching process. After the dummy gate structure 120 is removed, a portion of each fin structure 108 and a portion of the isolation feature 116a in the opening 140 are exposed.

Figure 2A:
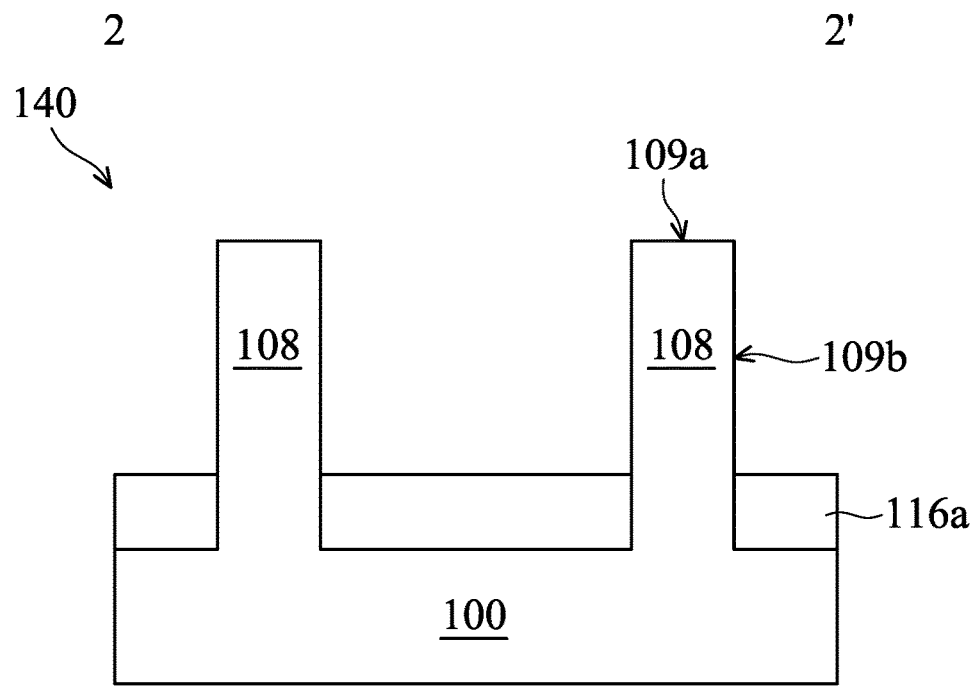
FIGS. 2A to 2H show cross-sectional representations of various stages of forming the FinFET structure after the structure of FIG. 1I, in accordance with some embodiments of the disclosure.

FIGS. 2A to 2H show cross-sectional representations of various stages of forming the FinFET structure after the structure of FIG. 1I, in accordance with some embodiments of the disclosure. FIG. 2A shows a cross-sectional representation taken along line 2-2' of the structure shown in FIG. 1J.

The structure shown in FIG. 1J is provided, as shown in FIG. 2A in accordance with some embodiments. In some embodiments, the structure shown in FIG. 2A includes a substrate 100 having fin structures 108 protruding from the substrate 100. Each fin structure 108 exposed in the opening 140 has a top surface 109a and a sidewall 109b. A portion of an isolation feature 116a that is formed over the substrate 100 and surrounding the sidewall 109b of a bottom portion of each fin structure 108 is also exposed in the opening 140.

Figure 2B:
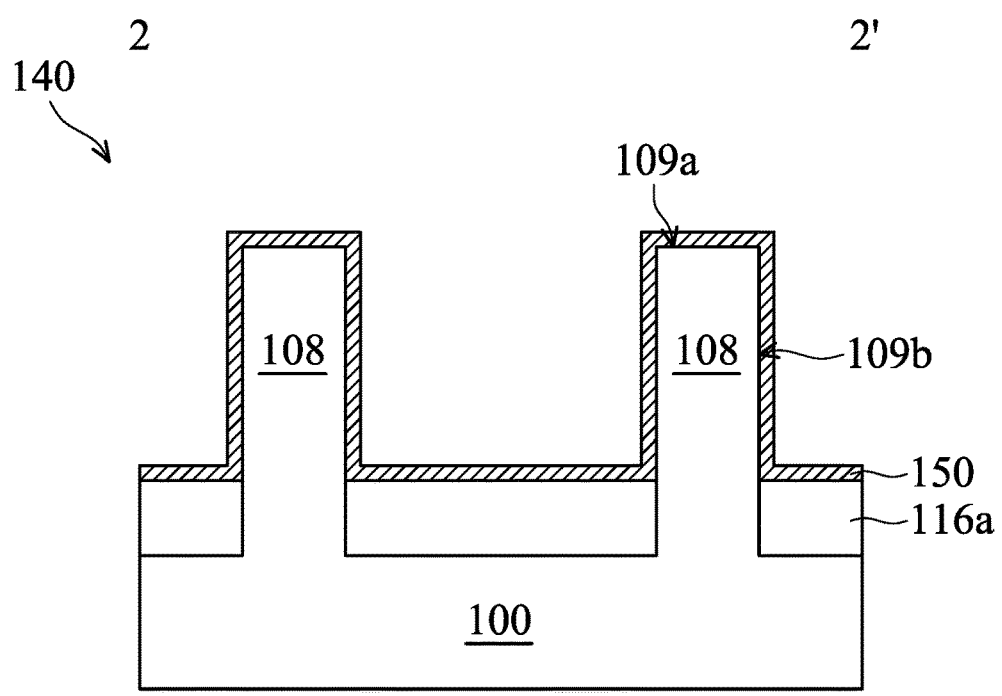
Figure 2C:
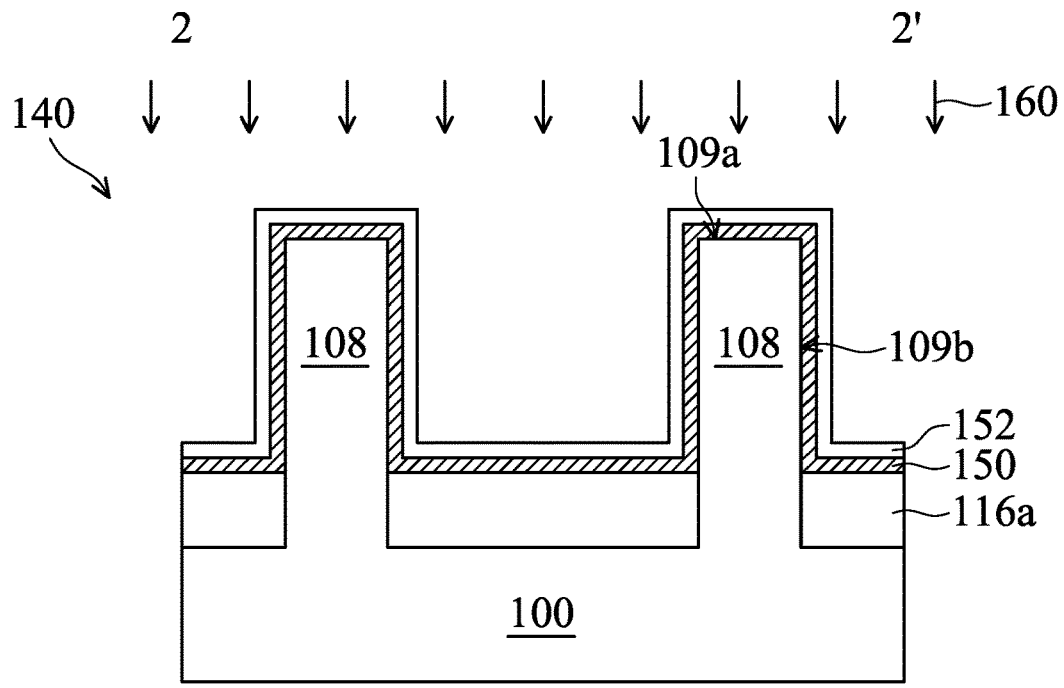
Figure 2D:
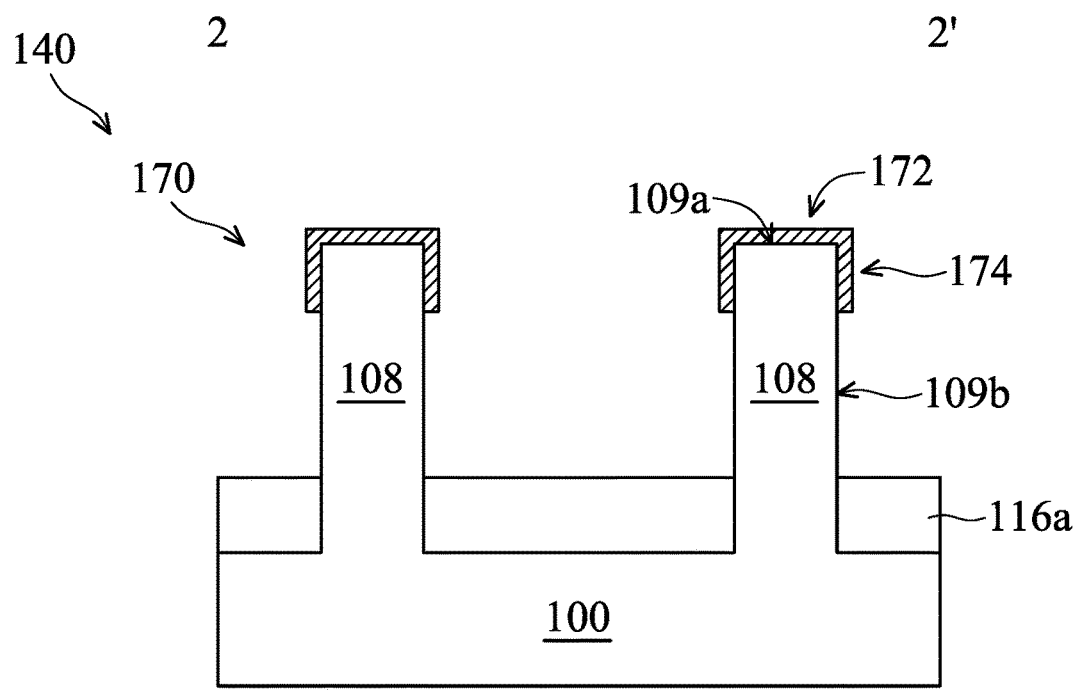

Afterwards, a masking cap 170 (as indicated in FIG. 2D) is formed over each exposed fin structure 108 in the opening 140, as shown in FIGS. 2B to 2D in accordance with some embodiments. As shown in FIG. 2B, a first liner layer 150 is formed over the exposed isolation feature 116a and conformally covers the top surface 109a and the sidewall 109b of each exposed fin structure 108 in the opening 140. In some embodiments, the first liner layer 150 has a thickness that is in a range from about 10 Å to about 20 Å. In some embodiments, the first liner layer 150 is made of metal nitride, such as tantalum nitride (TaN), and is formed by chemical vapor deposition (CVD), physical vapor deposition (PVD), atomic layer deposition (ALD), plasma enhanced chemical vapor deposition (PECVD), or other applicable processes.

Afterwards, a second liner layer 152 is formed over the first liner layer 150 to conformally covers the top surface 109a and the sidewall 109b of each exposed fin structure 108 in the opening 140, as shown in FIG. 2C in accordance with some embodiments. In some embodiments, the second liner layer 152 has a thickness greater than that of the first liner layer 150. As an example, the second liner layer 152 has a thickness that is in a range from about 20 Å to about 60 Å. In some embodiments, the second liner layer 152 is made of a tungsten-containing material, such as tungsten carbide or tungsten nitride, or the like, and is formed by chemical vapor deposition (CVD), atomic layer deposition (ALD), or other applicable processes.

After the second liner layer 152 and the first liner layer 150 are formed, the second liner layer 152 and the first liner layer 150 are patterned, as shown in FIG. 2C in accordance with some embodiments. In some embodiments, the second liner layer 152 and the first liner layer 150 are patterned by performing a wet etching process 160 by using an etching solution including an oxidant and a phosphate-containing activator.

In some embodiments, the oxidant includes ozone or hydrogen peroxide and the phosphate-containing activator includes ammonium phosphate, ammonium dihydrogen phosphate, phosphoric acid, or the like. In some embodiments, the concentration of the oxidant and the phosphate-containing activator in the etching solution is in a range from about 1 wt % to about 5 wt %, such as higher than 2%. In some embodiments, the wet etching process 160 is performed for a sufficient time that is in a range from about 2 minutes to about 5 minutes at temperature in a range from about 40° C. to about 70° C.

The material of the second liner layer 152 is selected, such that the second liner layer 152a higher etching rate than the first liner layer 150 with respect to such an etching solution including the oxidant and the phosphate-containing activator. The second liner layer 152 is used or serves as an etch-assisted layer of the first liner layer 150, so as to facilitate the removal of the first liner layer 150 during the wet etching process 160. After the wet etching process 160 is performed, the second liner layer 152 is completely removed.

It should be noted that the first liner layer 150 over the sidewall 109b of the fin structure 108 and over the isolation feature 116a has a deposition structure that is weaker than that of the first liner layer 150 near the top surface 109a of the fin structure 108. Moreover, in the etching solution used for the wet etching process 160, the phosphate-containing activator is employed to mitigate the etch of the second liner layer 152 and the first liner layer 150 formed over the top surface 109a of the fin structure 108. Therefore, the first liner layer 150 near the top surface 109a of the fin structure 108 remains, and the other portions of the first liner layer 150 are entirely removed after the wet etching process 160 is performed. Namely, a portion of the first liner layer 150 covering the top surface 109a of the fin structure 108 and a portion of the sidewall 109b of the fin structure 108 are remained after the wet etching process 160 is completed. As a result, the masking cap 170 that is made of the remained first liner layer 150 and includes a plate portion 172 and a wall portion 174 extending from the plate portion 172 is formed, as shown in FIG. 2D.

As shown in FIG. 2D, the plate portion 172 of the formed masking cap 170 covers the top surface 109a of the respective exposed fin structure 108 in the opening 140. Moreover, the wall portion 174 of the formed masking cap 170 partially exposes the sidewall 109b of the respective exposed fin structure 108 in the opening 140.

Figure 2E:
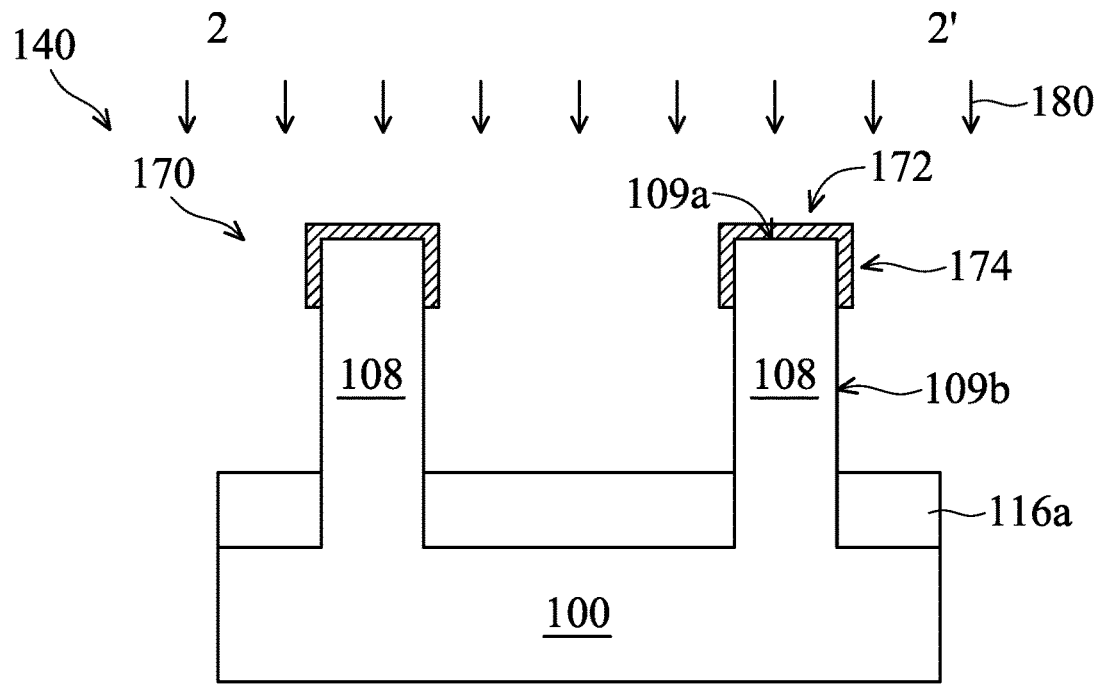
Figure 2F:
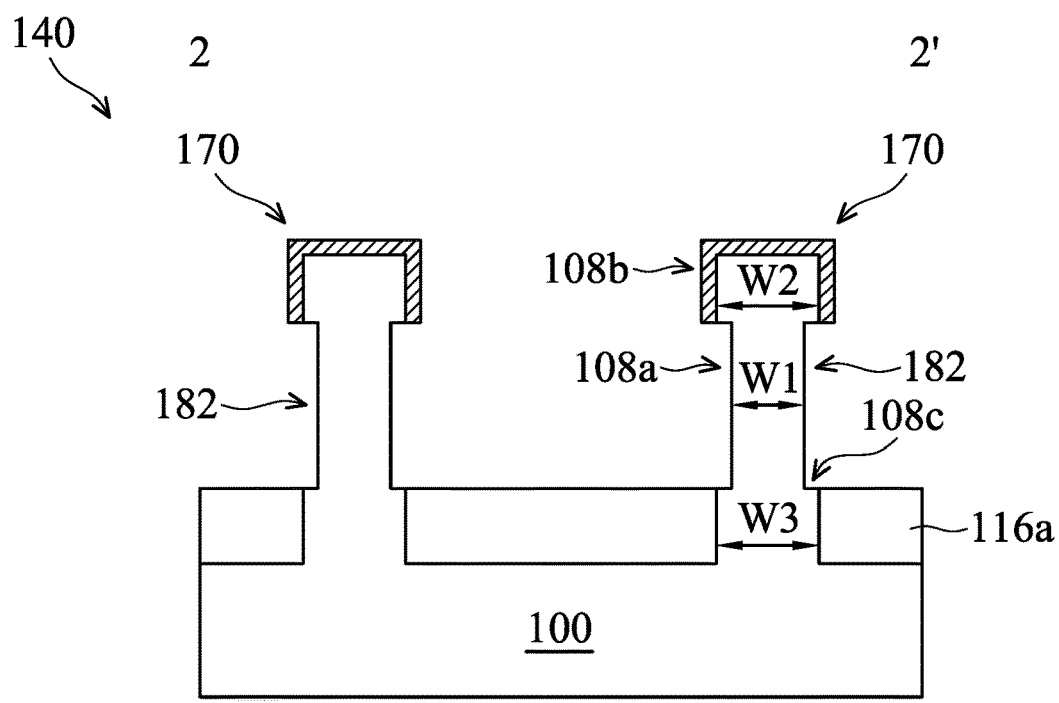

Afterwards, the partially exposed sidewall 109b of each fin structure 108 in the opening 140 is laterally recessed by performing an etching process 180 (which is also referred to as a fin-trim process), as shown in FIG. 2E in accordance with some embodiments. In some embodiments, a portion of the fin structure 108 is removed or etched from the sidewall 109b of the fin structure 108 by using the masking cap 170 (i.e., the remained first liner layer 150) as an etch mask, so as to form a lateral recess 182 in the fin structure 108, as shown in FIG. 2F.

The lateral recess 182 makes the fin structure 108 have different widths. More specifically, as shown in FIG. 2F, the fin structure 108 protruding from the substrate 100 and partially surrounded by the isolation feature 116a includes a first portion 108a (or middle portion), a second portion 108b (or top portion), and a third portion 108c (or bottom portion). The first portion 108a protrudes above the isolation feature 116a and has a first width W1. The second portion 108b extends from the top of the first portion 108a and has a second width W2 greater than the first width W1, so that the fin structure 108 above the isolation feature 116a including the first portion 108a and the second portion 108b has a T-shaped profile. The third portion is surrounded by the isolation feature 116a and has a third width W3 greater than the first width W1. The third width W3 may be substantially equal to or slightly greater than the second width W2.

The masking cap 170 provides a protection of the top portion (i.e., the second portion 108b) of the fin structure 108 during the fin-trim process (i.e., the etching process 180) is performed, so that the fin loss or damage at its top portion during the fin-trim process can be prevented. As a result, fin collapse can be prevented after the fin-trim process is performed, thereby maintain or increasing the reliability of the device with the fin structure.

In some embodiments, the etching process 180 is a wet etching process using an etching solution including a base (such as ammonium hydroxide, tetramethyl ammonium hydroxide, or the like). In some embodiments, the concentration of the base in the etching solution is in a range from about 1 wt % to about 5 wt %, such as higher than 2%. In some embodiments, the etching process 180 (i.e., the wet etching process using an etching solution including a base) is performed for a sufficient time that is in a range from about 2 minutes to about 10 minutes at temperature in a range from about 40° C. to about 70° C.

Figure 2G:
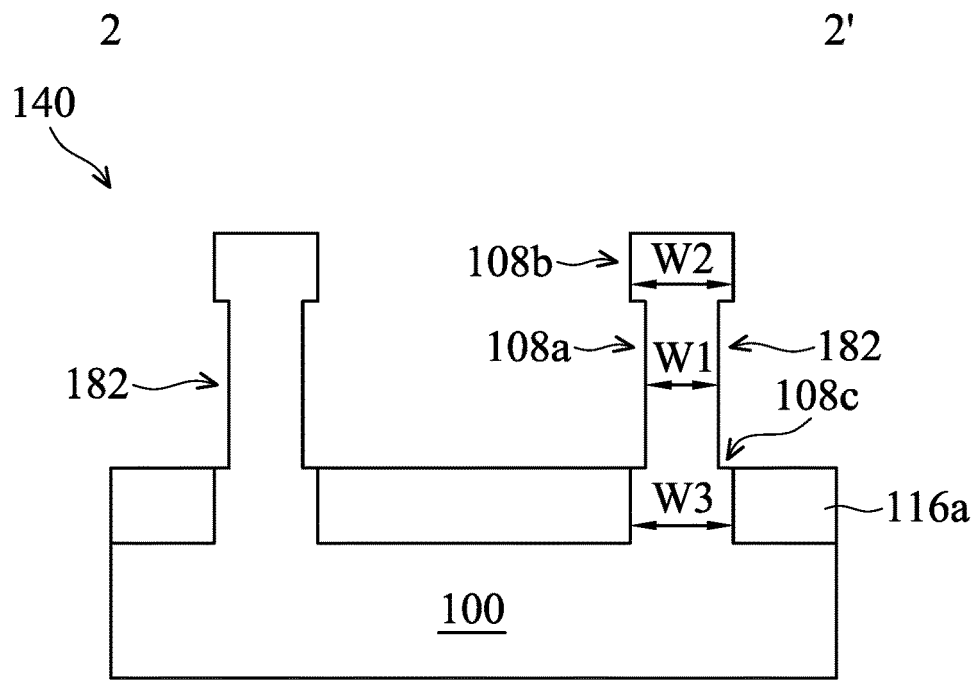

After the lateral recess 182 is formed to partially thinning the fin structure 108 in the opening 140, the masking cap 170 (shown in FIG. 2F) is removed from the fin structure 108, as shown in FIG. 2G in accordance with some embodiments. In some embodiments, the masking cap 170 is removed by a dry etching process, so as to expose the second portion 108b of the fin structure 108. In the structure shown in FIG. 2G, the partially thinned fin structure 108 formed by the fin-trim process can enhance device performance.

Similarly, although the masking cap 170 is removed from the fin structure 108, the wider top portion (i.e., the second portion 108b) of the fin structure 108 can provide an etch-compensation to mitigate the fin loss at the top portion of the fin structure 108 in subsequent processes (e.g., etching and/or cleaning processes), if presented, thereby preventing the thinned fin from collapsing, so as to maintain the reliability of the device with a fin structure. Accordingly, in some embodiments, the width of the top portion (i.e., the width W2 of the second portion 108b) is reduced after such subsequent processes (e.g., etching and/or cleaning processes) are performed and is denoted as W4 (as indicated in FIG. 2H).

Figure 2H:
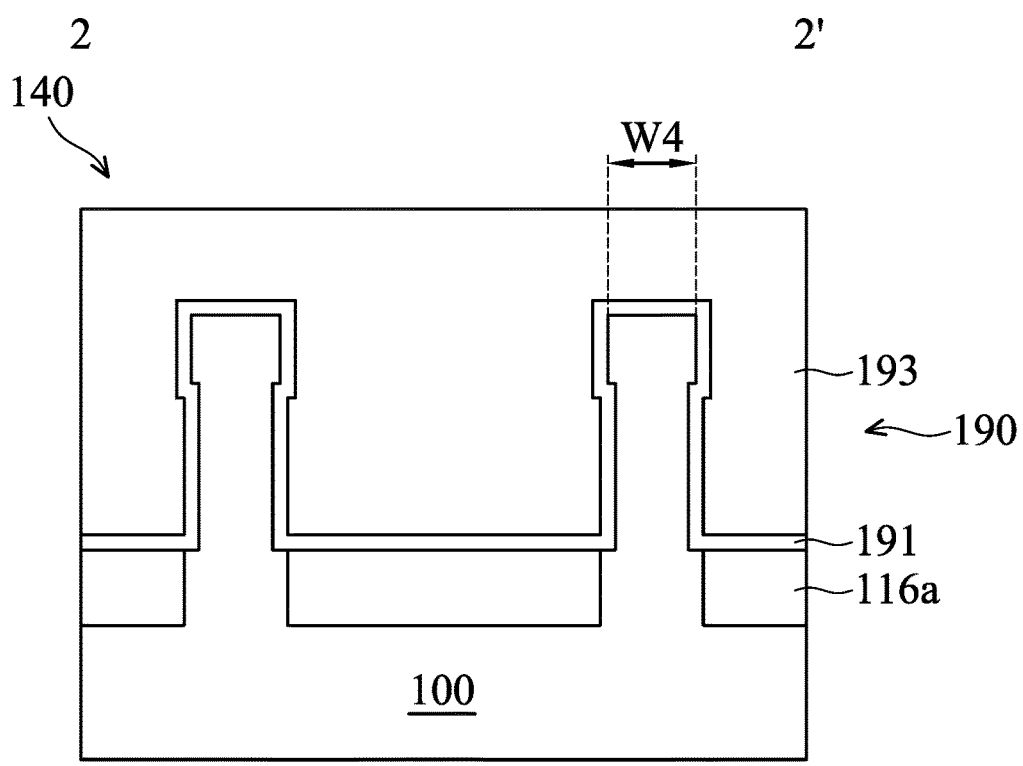

After the masking cap 170 is removed, a gate structure 190 is formed in opening 140, as shown in FIG. 2H in accordance with some embodiments. More specifically, a gate dielectric layer 191 is conformally formed over the insulating layer 136 (as shown in FIG. 1J) and conformally covers the inner surface of the opening 140 (as shown in FIG. 1J). The gate dielectric layer 191 formed in the opening 140 may cover the gate spacer layers 126 and each exposed fin structure 108 in the opening 140. In some embodiments, the gate dielectric layer 191 is made of a high k dielectric material, such as metal oxide. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the gate dielectric layer 191 may be formed by chemical vapor deposition (CVD), physical vapor deposition, (PVD), atomic layer deposition (ALD), or another applicable process.

An interfacial layer (not shown) may be formed between each exposed fin structure 108 and the gate dielectric layer 191, so that the adhesion of the gate dielectric layer 191 can be improved. In some embodiments, the interfacial layer is made of $SiO_2$. In some embodiments, the interfacial layer is formed by an atomic layer deposition (ALD) process, a thermal oxidation process, chemical vapor deposition (CVD) process, or another applicable process.

After the gate dielectric layer 191 is formed, a work functional metal layer (not shown) is conformally formed over the insulating layer 136 and conformally covers the inner surface of the opening 140 that is covered by the gate dielectric layer 191, in accordance with some embodiments. The work function metal layer is tuned to have a proper work function. In some embodiments, the work function metal layer is made of an N-type work-function metal or a P-type work-function metal. N-type work-function metals include titanium (Ti), aluminum (Al), titanium aluminum alloy (TiAl), titanium aluminum nitride (TiAlN), titanium aluminum carbide (TiAlC), tantalum carbide (TaC), tantalum carbon nitride (TaCN), and combinations thereof. The P-work-function metal includes titanium nitride (TiN), tungsten nitride (WN), tantalum nitride (TaN), or a combination thereof. In some embodiments, the work function metal layer 162 is formed by atomic layer deposition (ALD), sputtering, physical vapor deposition (PVD), or another applicable process.

In some other embodiments, a conformal capping or barrier layer (not shown) is formed over the gate dielectric layer 191 prior to formation of the work function metal layer, so that the capping or barrier layer is between gate dielectric layer 191 and the work function metal layer. The capping or barrier layer is employed to prevent the metal formed over it from penetrating into the channel region of the fin structure (e.g., the fin structure 108 in the opening 140) below the metal gate structure (e.g., the gate structure 190). In some embodiments, the capping or barrier layer is made of metal nitride. Examples of the metal nitride include TiN, TaN, and WN. The capping or barrier layer may be formed by physical vapor deposition, (PVD), atomic layer deposition (ALD), or another applicable process.

After the work functional metal layer is formed, a gate electrode layer 193 is formed over the insulating layer 136 and fills the opening 140 to cover the work functional metal layer, in accordance with some embodiments.

In some embodiments, the gate electrode layer 193 is made of tungsten (W). In some embodiments, the gate electrode layer 193 is formed by chemical vapor deposition (CVD), high density plasma CVD (HDPCVD), metal organic CVD (MOCVD), plasma enhanced CVD (PECVD), or another applicable process.

In some other embodiments, a conformal blocking layer (not shown) is formed over the work functional metal layer prior to formation of the gate electrode layer 193, so that the blocking layer is between work functional metal layer and the gate electrode layer 193. The blocking layer is employed to prevent the byproduct formed during the gate electrode layer 193 deposition from diffusing toward the layers below. In some embodiments, the blocking layer is made of metal nitride. Examples of metal nitride include TiN, TaN, and WN. The blocking layer may be formed by physical vapor deposition, (PVD), atomic layer deposition (ALD), or another applicable process.

After the gate electrode layer 193 is formed, the gate electrode layer 193, the work function metal layer, and the gate dielectric layer 191 over the insulating layer 136 are successively removed, as shown in FIG. 2H in accordance with some embodiments. For example, the gate electrode layer 193, the work function metal layer 162, and the gate dielectric layer 191 over the insulating layer 136 are successively removed by a chemical mechanical polishing (CMP) process to expose a top surface of the insulating layer 136. As a result, the gate structure 190 is formed in the opening 140. In some embodiments, the gate structure 190 at least includes the gate dielectric layer 191, the work function metal layer, and the gate electrode layer 193.

Embodiments of a semiconductor device structure and a method for forming the same are provided. The semiconductor device structure includes a first liner layer that covers a top surface and a sidewall of a fin structure. The first liner layer is patterned by a wet etching process, so as to form a masking cap that covers the top surface of the fin structure and a portion of the sidewall of the fin structure. Afterwards, the fin structure is thinned by using the masking cap as an etch mask. The masking cap provides a protection of the top portion of the fin structure during the fin structure is thinned, so that the fin structure has a top portion with a width greater than that of the other portion of the fin structure that is thinned. As a result, the partially thinned fin structure can enhance device performance. The wider top portion of the fin structure can also serve as an etch-compensation to mitigate the fin loss or damage at its top portion in subsequent etching and/or cleaning processes for device fabrication, thereby preventing device degradation.

In some embodiments, a method of forming a semiconductor device structure is provided. The method includes forming a fin structure protruding from a substrate and forming a first liner layer to cover a top surface and a sidewall of the fin structure. The method also includes patterning the first liner layer by performing a wet etching process, so as to remain a portion of the first liner layer covering the top surface of the fin structure and a portion of the sidewall of the fin structure. The method also includes removing a portion of the fin structure from the sidewall of the fin structure by using the remained portion of the first liner layer as an etch mask, so as to form a lateral recess in the fin structure.

In some embodiments, a method of forming a semiconductor device structure is provided. The method includes forming a first gate structure over a fin structure that protrudes from a substrate and forming source and drain features over the fin structure on opposing sidewall surfaces of the first gate structure. The method also includes forming an insulating layer over the substrate and covering the source and drain features and removing the first gate structure to form an opening in the insulating layer and expose the fin structure in the opening. The method also includes forming a masking cap over the exposed fin structure in the opening. The masking cap includes a plate portion covering a top surface of the exposed fin structure in the opening. The masking cap also includes a wall portion extending from the plate portion and partially exposing a sidewall of the exposed fin structure in the opening. The method also includes laterally recessing the partially exposed sidewall of the fin structure in the opening.

In some embodiments, a semiconductor device structure is provided. The semiconductor device structure includes an isolation feature over a substrate and a fin structure protruding from the substrate and partially surrounded by the isolation feature. The fin structure includes a first portion above the isolation feature and having a first width. The fin structure also includes a second portion extending from the top of the first portion and having a second width greater than the first width, so that the fin structure above the isolation feature has a T-shaped profile. The semiconductor device structure also includes a gate structure covering the first portion and the second portion of the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device structure, comprising:
    forming a fin structure protruding from a substrate;
    forming a first liner layer to cover a top surface and a sidewall of the fin structure;
    patterning the first liner layer by performing a wet etching process, so as to remain a portion of the first liner layer covering the top surface of the fin structure and a portion of the sidewall of the fin structure; and
    removing a portion of the fin structure from the sidewall of the fin structure by using the remained portion of the first liner layer as an etch mask, so as to form a lateral recess in the fin structure.

2. The method as claimed in claim 1, further comprising:
    forming a second liner layer over the first liner layer before the first liner layer is patterned; and
    patterning the second liner layer during the wet etching process, wherein the second liner layer serves as an etch-assisted layer of the first liner layer during the wet etching process, so that the second liner layer is completely removed after the wet etching process is performed.

3. The method as claimed in claim 2, wherein the first liner layer is made of tantalum nitride and the second liner layer is made of a tungsten-containing material.

4. The method as claimed in claim 3, wherein the wet etching process is performed using an etching solution comprising an oxidant and a phosphate-containing activator.

5. The method as claimed in claim 1, further comprising forming an isolation feature over the substrate and surrounding a bottom portion of the fin structure prior to formation of the first liner layer.

6. The method as claimed in claim 5, wherein the fin structure above the isolation feature has a T-shaped profile after the lateral recess is formed.

7. The method as claimed in claim 1, wherein the portion of the fin structure is removed by a second wet etching process.

8. The method as claimed in claim 1, further comprising removing the remained portion of the first liner layer after the lateral recess is formed.

9. A method of forming a semiconductor device structure, comprising:
    forming a first gate structure over a fin structure that protrudes from a substrate;
    forming source and drain features over the fin structure on opposing sidewall surfaces of the first gate structure;
    forming an insulating layer over the substrate and covering the source and drain features;
    removing the first gate structure to form an opening in the insulating layer and expose the fin structure in the opening;
    forming a masking cap over the exposed fin structure in the opening, wherein the masking cap comprises:
        a plate portion covering a top surface of the exposed fin structure in the opening; and
        a wall portion extending from the plate portion and partially exposing a sidewall of the exposed fin structure in the opening; and
    laterally recessing the partially exposed sidewall of the fin structure in the opening.

10. The method as claimed in claim 9, wherein the formation of the masking cap comprises:
    conformally forming a tantalum nitride layer over the top surface and the sidewall of the fin structure in the opening;
    conformally forming a tungsten-containing layer over the tantalum nitride layer; and
    patterning the tungsten-containing layer and the tantalum nitride layer by performing a wet etching process, wherein the tungsten-containing layer is completely removed and a portion of the tantalum nitride layer remains to form the plate portion and the wall portion of the masking cap.

11. The method as claimed in claim 10, wherein the wet etching process is performed using an etching solution comprising an oxidant and a phosphate-containing activator.

12. The method as claimed in claim 9, further comprising removing the masking cap after the partially exposed sidewall of the fin structure in the opening is laterally recessed.

13. The method as claimed in claim 12, further comprising forming a second gate structure over the fin structure in the opening after the masking cap is removed.

14. The method as claimed in claim 9, wherein the partially exposed sidewall of the fin structure in the opening is laterally recessed by a wet etching process.

15. The method as claimed in claim 9, further comprising forming an isolation feature over the substrate and surrounding a bottom portion of the fin structure prior to formation of the first gate structure, wherein the fin structure above the isolation feature has a T-shaped profile after the partially exposed sidewall of the fin structure in the opening is laterally recessed.

16. A method of forming a semiconductor device structure, comprising:
    forming a fin structure protruding from a substrate and comprising a bottom portion near the substrate, a top portion and a middle portion between the bottom portion and the top portion;
    forming an isolation feature over the substrate to cover the bottom portion of the fin structure;
    covering the top portion of the fin structure with a masking cap, so that the middle portion of the fin structure is exposed from the isolation feature and the masking cap; and
    etching the exposed middle portion of the fin structure, so that a width of the etched middle portion of the fin structure is less than a width of the top portion of the fin structure.

17. The method as claimed in claim 16, further comprising:
    removing the masking cap after etching the exposed middle portion of the fin structure; and
    forming a gate structure to cover the top portion of the fin structure and the etched middle portion of the fin structure.

18. The method as claimed in claim 16, wherein the masking cap comprises:
    a plate portion covering a top surface of the top portion of the fin structure; and
    a wall portion extending from the plate portion and covering a sidewall of the top portion of the fin structure.

19. The method as claimed in claim 16, wherein the masking cap is made of tantalum nitride.

20. The method as claimed in claim 19, wherein the exposed middle portion of the fin structure is etched by a wet etching process using an etching solution that comprises a base.

* * * * *